United States Patent
Icoz et al.

(10) Patent No.: US 9,295,185 B2
(45) Date of Patent: Mar. 22, 2016

(54) SEALED ENCLOSURE FOR POWER ELECTRONICS INCORPORATING A HEAT EXCHANGER

(71) Applicant: Transistor Devices, Inc., Hackettstown, NJ (US)

(72) Inventors: Tunc Icoz, Bridgewater, NJ (US); John Santini, Columbia, NJ (US); Gary Mulcahy, Flanders, NY (US); James Feely, Hackettstown, NJ (US)

(73) Assignee: Transistor Devices, Inc., Hackettstown, NJ (US)

( * ) Notice: Subject to any disclaimer, the term of this patent is extended or adjusted under 35 U.S.C. 154(b) by 126 days.

(21) Appl. No.: 14/205,834

(22) Filed: Mar. 12, 2014

(65) Prior Publication Data

US 2014/0262150 A1 Sep. 18, 2014

Related U.S. Application Data

(60) Provisional application No. 61/779,469, filed on Mar. 13, 2013.

(51) Int. Cl.
 *H05K 7/20* (2006.01)

(52) U.S. Cl.
 CPC .................................. *H05K 7/20927* (2013.01)

(58) Field of Classification Search
 CPC ........... H05K 7/20; H05K 5/02; H05K 7/209; H05K 7/20909; H05K 7/20645; G06F 1/20; F28F 7/00; H01L 23/10; H01L 23/34; H01L 23/427; H01L 23/473; H01L 28/40; H02M 7/00; H02M 1/00; B22D 25/02; F28D 5/00; F28D 1/04
 USPC ............... 361/679.53, 679.54, 689, 698, 699, 361/704, 707, 710, 714, 715, 719, 720, 361/721; 165/80.2, 80.4, 80.5, 104.19, 165/104.22, 104.33, 104.34, 185; 174/15.1, 174/547, 548; 62/259.2
 See application file for complete search history.

(56) References Cited

U.S. PATENT DOCUMENTS 1,621,742 A 3/1927 Kessler
1,818,387 A 8/1931 Dinzl
(Continued)

FOREIGN PATENT DOCUMENTS

WO 0235898 A1 5/2002

OTHER PUBLICATIONS

White Paper TW0055, "Next Generation Military Vehicle Power Conversion Modules", published in Mar. 2008 by TDI Power (Transistor Devices, Inc.).

*Primary Examiner* — Michail V Datskovskiy
(74) *Attorney, Agent, or Firm* — Brown & Michaels, PC

(57) ABSTRACT

A functional heat exchanger structure provides a hermetic seal for the power electronics. The heat exchanger includes one or more features built into the design. The features include a closed loop liquid circuit, air, or extended surfaces built-in to the design to transfer heat from the heat generating devices, spring clips snapped in built-in slots to mount heat-generating devices, preformed threaded rails to mount the printed circuit board (PCB), electrical isolation between the heat sink/cold plate and the electrical components, a sealed enclosure to provide environmental protection for the electronic components, a mounting feature to mount the sealed enclosure onto an external surface, an opening to accept a snap-in style cover, a stackable design, and an easily manifoldable configuration.

18 Claims, 4 Drawing Sheets

(56) References Cited

U.S. PATENT DOCUMENTS

| | | | | |
|---|---|---|---|---|
| 1,929,824 | A | 10/1933 | Polley | |
| 2,743,347 | A | 4/1956 | Porter | |
| 3,865,183 | A * | 2/1975 | Roush | F25D 15/00 165/53 |
| 3,904,933 | A | 9/1975 | Davis | |
| 5,159,529 | A | 10/1992 | Lovgren et al. | |
| 5,461,542 | A * | 10/1995 | Kosak | B60R 16/0239 165/185 |
| 5,829,516 | A | 11/1998 | Lavochkin | |
| 5,909,358 | A * | 6/1999 | Bradt | H01L 23/4093 257/726 |
| 6,031,751 | A | 2/2000 | Janko | |
| 6,213,195 | B1 | 4/2001 | Downing et al. | |
| 6,326,761 | B1 * | 12/2001 | Tareilus | H02M 7/003 318/722 |
| 6,333,849 | B1 | 12/2001 | Donahoe et al. | |
| 6,828,675 | B2 | 12/2004 | Memory et al. | |
| 7,286,355 | B2 | 10/2007 | Cheon | |
| 7,320,359 | B2 | 1/2008 | Miettinen et al. | |
| 7,450,384 | B2 * | 11/2008 | Tavassoli | H05K 7/20636 165/80.4 |
| 7,552,758 | B2 | 6/2009 | Garner et al. | |
| 7,624,791 | B2 | 12/2009 | Strobel et al. | |
| 7,710,723 | B2 * | 5/2010 | Korich | H05K 7/20927 165/104.33 |
| 8,059,404 | B2 * | 11/2011 | Miller | H02M 7/003 165/104.33 |
| 8,477,498 | B2 * | 7/2013 | Porreca | H05K 7/1404 361/696 |
| 2003/0106681 | A1 | 6/2003 | Hauri et al. | |
| 2005/0241806 | A1 | 11/2005 | Liu | |
| 2007/0133171 | A1 * | 6/2007 | Cheon | H05K 7/20636 361/699 |
| 2008/0218970 | A1 | 9/2008 | Kehret et al. | |
| 2010/0044023 | A1 | 2/2010 | Canales et al. | |

* cited by examiner

SEALED ENCLOSURE FOR POWER ELECTRONICS INCORPORATING A HEAT EXCHANGER

REFERENCE TO RELATED APPLICATIONS

This application claims one or more inventions which were disclosed in Provisional Application No. 61/779,469, filed Mar. 13, 2013, entitled "FUNCTIONAL HEAT EXCHANGER AND SEALED ENCLOSURE FOR POWER ELECTRONICS". The benefit under 35 USC §119 (e) of the United States provisional application is hereby claimed, and the aforementioned application is hereby incorporated herein by reference.

FIELD OF THE INVENTION

The invention pertains to the field of heat exchangers. More particularly, the invention pertains to a heat exchanger with a sealed enclosure for power electronics.

DESCRIPTION OF RELATED ART

As the power densities in power electronic packages go up, there is an increasing demand for better thermal management solutions, both in the air and liquid cooled applications. Typical thermal solutions employ a heat sink, or a cold plate to transfer the heat from heat generating components and reject it to a cooling media, i.e. air or liquid. These heat sinks/cold plates typically have threaded holes to mount the printed circuit board assemblies and any heat generating devices. These mounting features are created by secondary machining operations. Moreover, conventional heat sink/cold plate assemblies require a metal frame built around it to provide an environmental seal where needed. Not only does this add more complexity to the design, but it also increases the cost and weight of the system.

SUMMARY OF THE INVENTION

A functional heat exchanger structure provides a hermetic seal for the power electronics. The heat exchanger includes one or more features built into the design. The features include a closed loop liquid circuit, air, or extended surfaces built-in to the design to transfer heat from the heat generating devices, spring clips snapped in built-in slots to mount heat-generating devices, preformed threaded rails to mount the printed circuit board (PCB), electrical isolation between the heat sink/cold plate and the electrical components, a sealed enclosure to provide environmental protection for the electronic components, a mounting feature to mount the sealed enclosure onto an external surface, an opening to accept a snap-in style cover, a stackable design, and an easily manifoldable configuration.

DETAILED DESCRIPTION OF THE INVENTION

A functional heat exchanger structure includes one or more features built into the design and provides a hermetic seal for the power electronics. These features include:
1. Means to transfer heat from the heat generating devices to liquid, by means of closed loop liquid circuit, or to air, by means of extended surfaces built-in to the design.
2. Means to mount heat generating devices via spring clips snapped in built-in slots.
3. Means to mount the printed circuit board using preformed threaded rails.
4. Means to provide electrical isolation (creepage clearance) between the heat sink/cold plate and the electrical components.
5. Means to provide environmental protection for the electronic components by forming a sealed enclosure.
6. Means to mount the sealed enclosure onto an external surface, such as, for example, a cabinet or a frame.
7. Means to accept a snap-in style cover.
8. Stackable design.
9. Easily manifoldable configuration.

Thermal management of electronic devices plays a crucial role in the reliable operation of electronic circuits. Conventional heat exchangers are relatively flat and require another frame around them for environmental protection. Embodiments of the present invention address the shortcomings of conventional designs by having unique features embedded in the design for higher levels of productability and environmental protection.

In the figures, elements which are the same as in earlier figures will be given the same reference numbers, and may not be separately discussed with respect to later figures.

Figure 1:
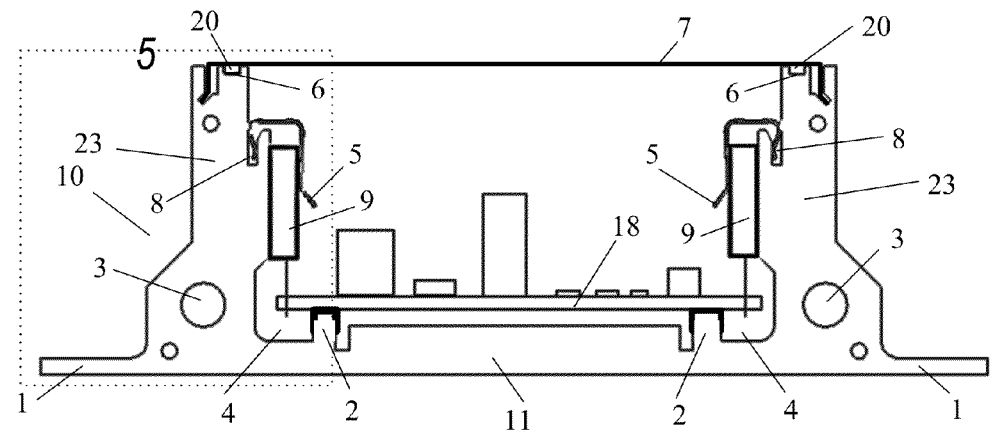
FIG. 1 shows a schematic partial cross sectional view of a heat exchanger with a U-shaped configuration in an embodiment of the present invention.

Some embodiments of the invention, as illustrated in FIG. 1 in one of its many possible configurations, are a generally U-shaped body 10 having a base 11 and two side walls 23, where the printed circuit board 18 is mounted above the base 11 and between the side walls 23, facing up, and the heat generating devices 9 are mated against the two side walls 23. The heat exchanger includes bulkhead mounting feet 1 as part of the base 11 extrusion and printed circuit board (PCB) mounting extruded rails 2. The heat exchanger has cooling channels 3 running across the length of the side walls that remove heat from electronic components. A clearance space 4 is included at the edge of the PCB 18 for voltage isolation. This built-in feature eliminates the need for extra insulation material.

Figure 4:
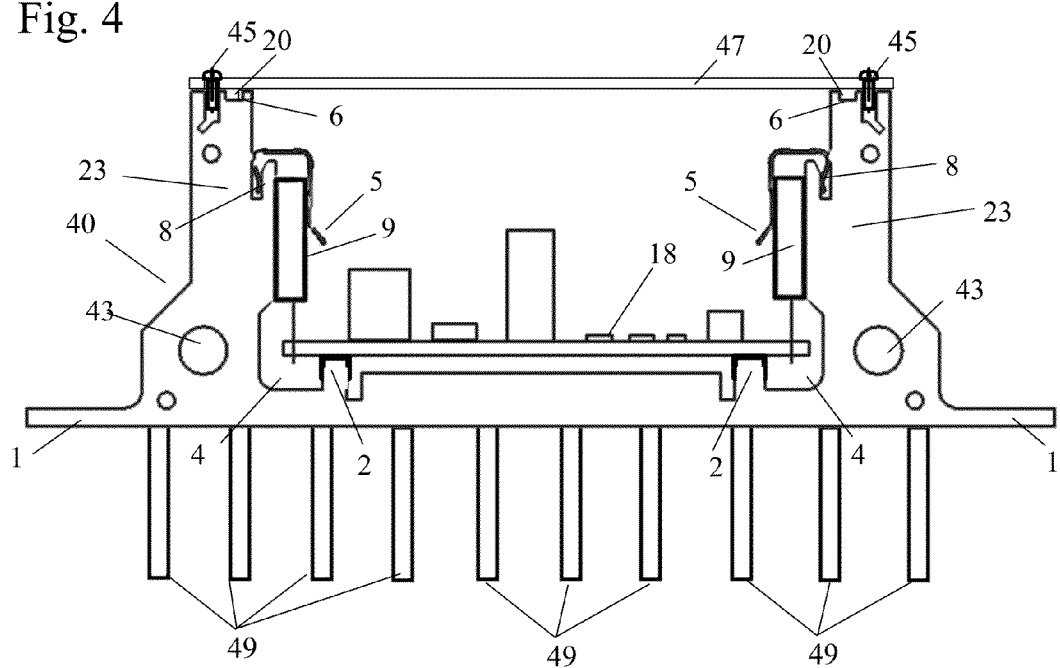
FIG. 4 shows a schematic partial cross sectional view of a heat exchanger with air-cooling in an embodiment of the present invention.

The heat exchanger also includes transistor mounting clips 5, a seal groove 6 with a seal 20 for the cover 7 to provide IP67/IP6K9K protection, and a cover 7. Although the cover 7 is shown as a snap in cover in FIG. 1, the cover 7 may alternatively be screwed down as shown in FIG. 4.

The heat exchanger preferably has built-in features, i.e. slots 8 and/or grooves, to allow heat generating components 9 to be coupled to the two side walls 23 for heat transfer. A slot 8 in the heat exchanger accepts the spring clip 5 for mounting of the component. This allows any number of devices 9 to be cooled, within the physical constraints, by being clipped to the side walls 23 without requiring any modification to the heat exchanger design. This is a significant deviation from conventional methods, where extra mounting holes are drilled or machined to accommodate different number of devices.

Figure 2:
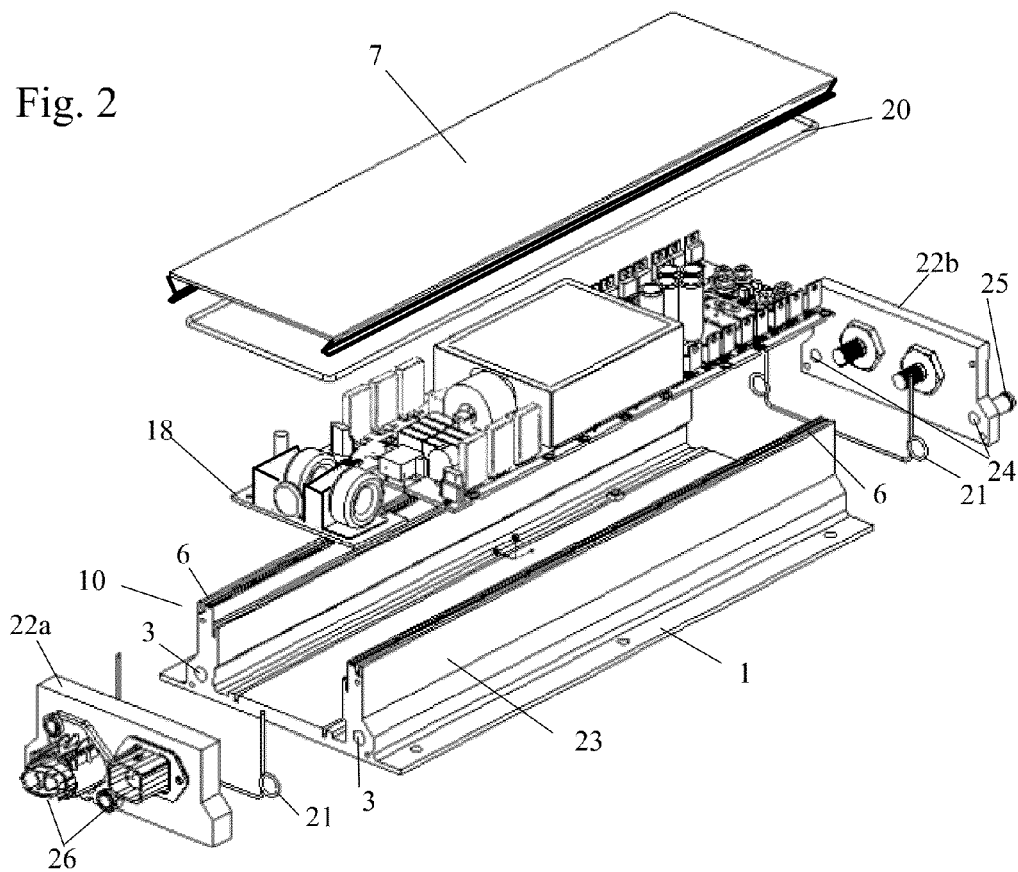
FIG. 2 shows an exploded isometric view of an enclosed heat exchanger module of FIG. 1, with two end caps and a top cover.

There is an increasing demand in certain industries that the electronics should be environmentally protected from water, pollutants, dust . . . etc. Conventional designs achieve this goal by building a box around the heat exchanger and the power electronic assembly. This results in a larger number of parts to be used to create a sealed unit. Embodiments of the present invention preferably provide environmental protection for the electronics by forming three sides of the enclosure, eliminating some of the parts need be employed otherwise. As a result, only two endcaps and a top cover are needed to fully enclose the sensitive electronics and form a sealed unit, as illustrated in FIG. 2. This approach provides a more reliable seal due to the lesser number of parts, and hence joints, forming the sealed enclosure.

An exploded isometric view of this heat exchanger configuration is shown in FIG. 2, in which the cover 7 is unsnapped and the seal 20 is removed from grooves 6. The printed circuit board 18 is raised above the U-shaped structure 10.

As can be seen in FIG. 2, the ends of the structure 10 are fitted with a first end cap 22a and a second end cap 22b, each end cap being sealed to the end of the structure 10 by a face gasket 21. The first end cap 22a is fitted with electrical connectors 26, as might be needed to interface with the circuitry on PCB 18. An internal bore (not shown) extending across the first end cap 22a, connects the two cooling channels 3, so that liquid can circulate from one to the other through end cap 22a. The second end cap 22b has passages aligned with the cooling channels in the side walls, passing through the end cap to fluid fittings 25 for supplying and withdrawing cooling fluid through cooling channels 3.

Figure 3:
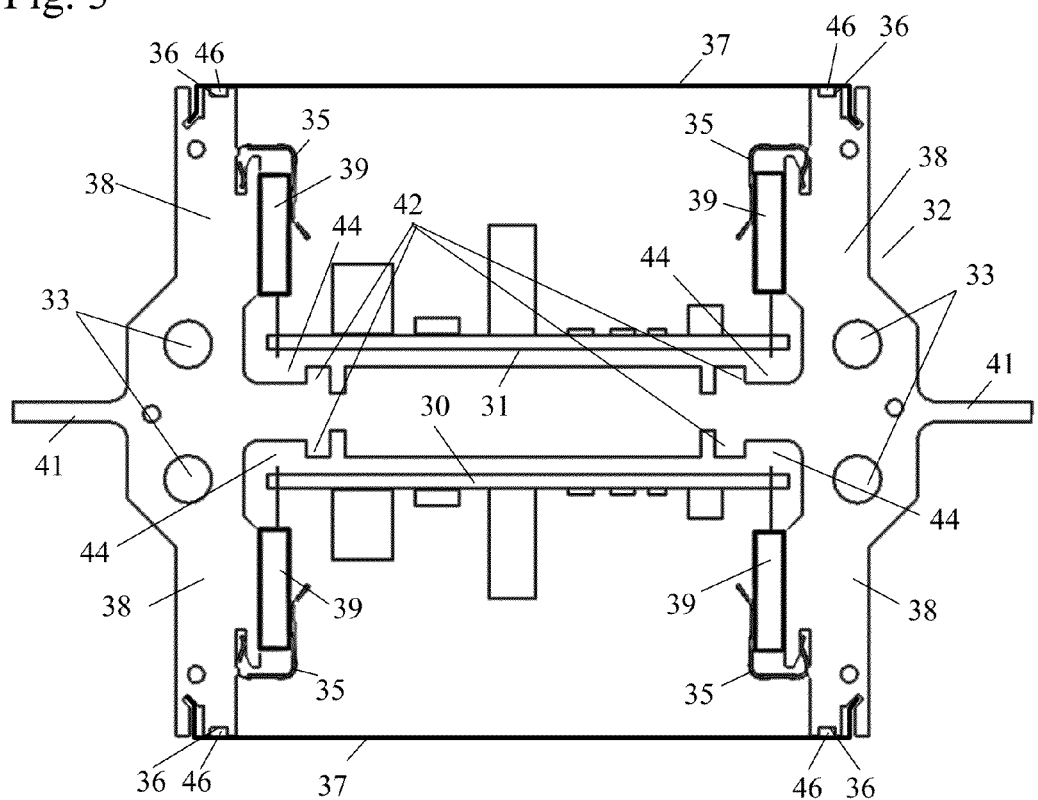
FIG. 3 shows a schematic partial cross sectional view of a heat exchanger with an H-shaped configuration in an embodiment of the present invention.

In another embodiment, the heat exchanger 32 is H-shaped (FIG. 3), where multiple PCB assemblies 30 and 31 can be packaged within the same structure, and the heat generating devices 39 are mated against the two side walls 38. The heat exchanger 32 includes bulkhead mounting feet 41 as part of the extrusion and printed circuit board (PCB) mounting extruded rails 42. The heat exchanger has cooling channels 33 running across the length of the side walls 38 that remove heat from electronic components. A clearance space 44 is included at the edge of the PCBs 30 and 31 for voltage isolation. This built-in feature eliminates the need for extra insulation material. The heat exchanger also includes transistor mounting clips 35, a seal groove 36 with a seal 46 for the cover 37 to provide IP67/IP6K9K protection, and a cover 37 on each side. Although the covers 37 are shown as snap in covers in FIG. 3, the covers 37 may alternatively be screwed down.

Embodiments of the present invention are not limited to liquid cooling applications. As shown in the configuration of FIG. 4, the structure 40 can also be configured with fins 49 extending out from one or more surfaces to adapt to an air cooled application. In this embodiment, no liquid is circulated inside the channels 43. Instead, heat is conducted through the walls 23 and gets rejected to ambient air by the fins 49.

The electrical isolation between the electrical components and the conductive chassis is an important design consideration for safe operation of power electronics. Insufficient spacing can cause arcing and/or electrical shorts during operation and can cause catastrophic failures. In conventional designs, an insulating material is typically added to the assembly to provide required isolation.

Figure 5:
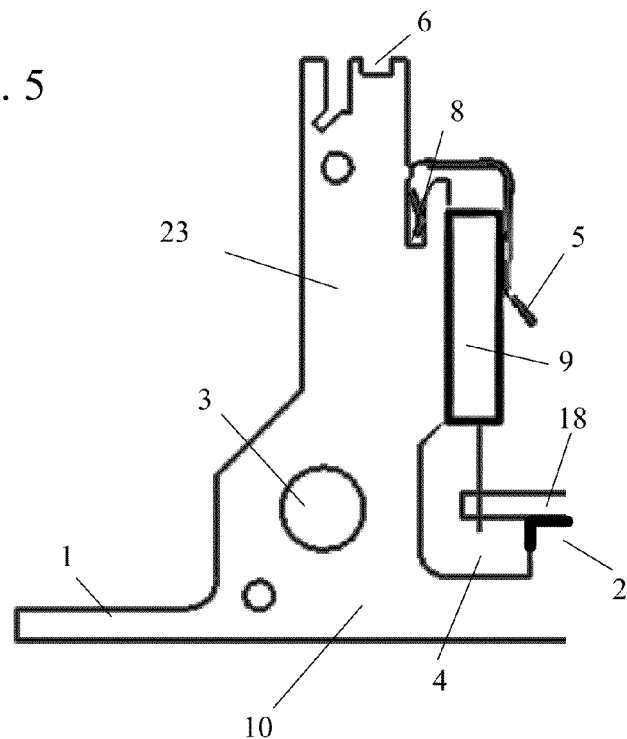
FIG. 5 shows a cross sectional detail view from the area enclosed in dotted lines 5 of FIG. 1.

Embodiments of the present invention preferably address the same problem by another built-in feature on the heat exchanger structure, as shown in FIG. 5, which shows an enlarged view of the area enclosed in dotted lines 5 in FIG. 1 (cover 7 and seal 20 being omitted from FIG. 5).

FIG. 5 shows the spring clip 5 mounting feature and a built-in electrical isolation clearance 4 for creepage of a heat exchanger in an embodiment of the present invention. Rather than using insulation materials, embodiments of the present invention preferably have clearance 4 at strategic locations to provide sufficient clearance between the components 9 and the heat exchanger body 10.

The heat exchanger preferably also has built-in threaded rails 2 on the bottom to allow PCBs to be mounted. This is shown in FIG. 1.

Figure 6:
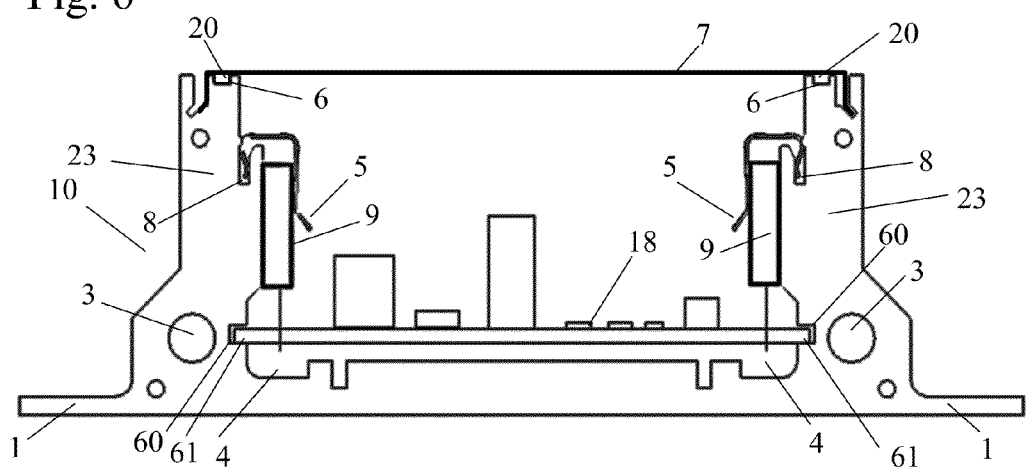
FIG. 6 shows a schematic partial cross sectional view of a heat exchanger module with built-in PCB slides in an embodiment of the present invention.

In another version, shown in FIG. 6, mounting slots 60 can be built-in to the side walls 23 of the heat exchanger, into which the edges 61 of a printed circuit board 18 can be slid for quick mounting.

Figure 7:
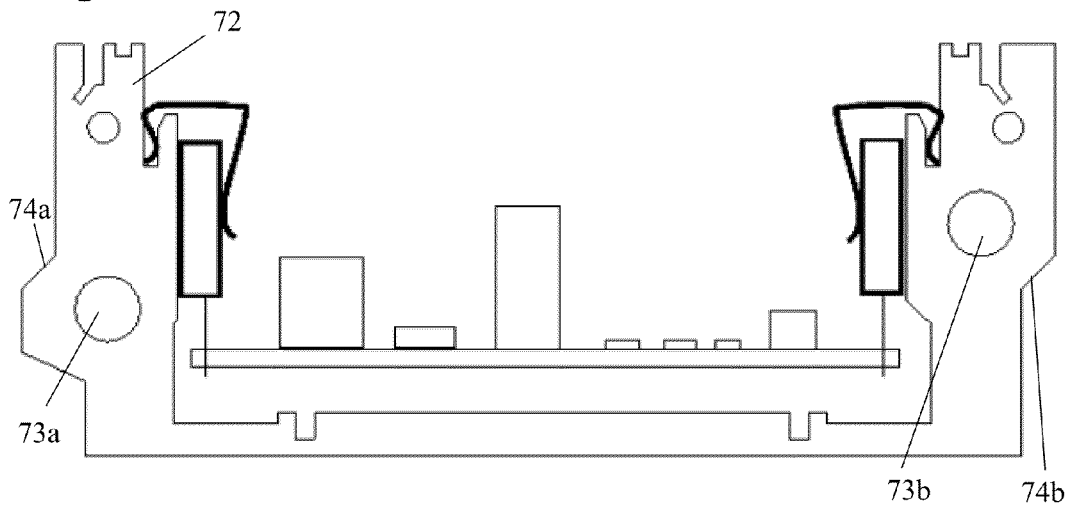
FIG. 7 shows a schematic partial cross sectional view of a heat exchanger with staggered cooling channels in an embodiment of the present invention.
Figure 8:
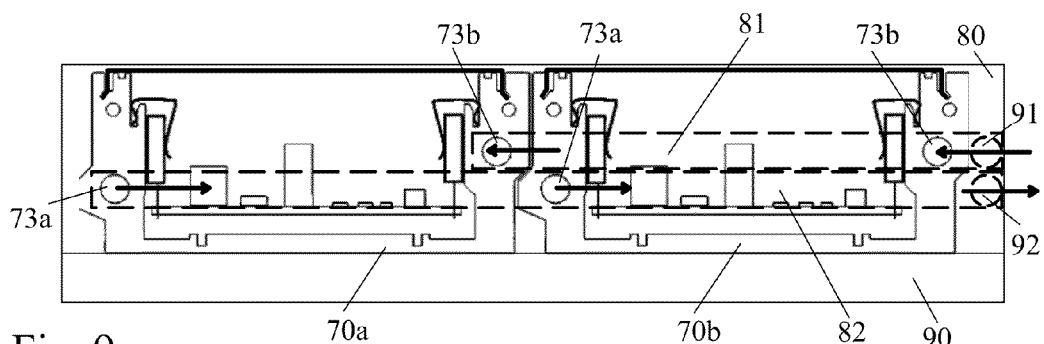
FIG. 8 shows a schematic partial cross sectional view of two heat exchanger modules of the embodiment of FIG. 7, with staggered cooling channels linked by a manifold.
Figure 9:
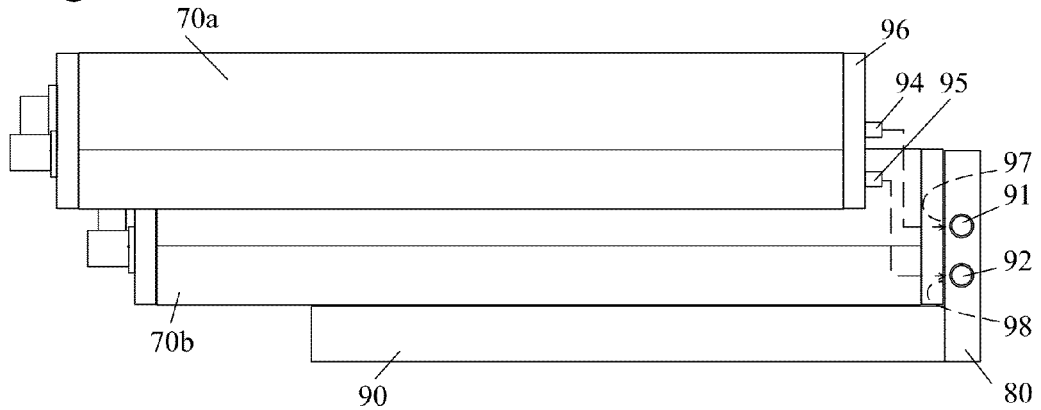
FIG. 9 shows a side view of two modules on a backplane and support, in the embodiment of FIG. 8.

In another embodiment, depicted in FIG. 7 through FIG. 9, the cooling channels 73a, 73b on each side of the heat exchanger 72 are vertically offset to ease distributing the coolant across two or more heat exchanger modules 70a, 70b. The sides of the heat exchanger 72 are formed with mating side protrusions 74a, 74b, to facilitate registration of multiple heat exchanger modules 70a, 70b in a side-by-side relationship.

The cooling channels 73a, 73b on each manifold connect to fluid fittings 94, 95 on the endcap 96 of each heat exchanger module 70a, 70b. The fluid fittings 94, 95 plug into mating sockets 97, 98, which are coupled to manifolds 81, 82 in a backplane 80. The backplane 80 may be mounted on or incorporate a shelf 90 or other supporting means.

Each manifold 81, 82 terminates in a fluid fitting, shown in FIG. 9 as inlet 91 and outlet 92, which permit connection of the manifolds 81, 82 in the backplane 80 to a source of circulating cooling fluid. Multiple backplanes 80 may, of course, be connected in series or parallel to facilitate cooling a plurality of modules 70 on a plurality of shelves 90 in a rack arrangement.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. An enclosure for electronic components comprising:
   a) a heat exchanger body for housing a printed circuit board, comprising:
      i) a base having an upper surface, a lower surface, a first end and a second end, and two sides;
      ii) a first side wall and a second side wall, each side wall having a first end adjacent the first end of the base and a second end adjacent the second end of the base, a lower edge joined to the upper surface of the base along a side of the base and an upper edge;
      iii) at least one cooling channel extending through each side wall from the first end to the second end;

iv) a first end cap sealed to the first end of the base and the first end of each of the side walls, having an internal bore extending across the first end cap and having openings aligned with the at least one cooling channel in each of the two side walls, so that the cooling channels in the two side walls are connected through the internal bore in the first end cap; and v) a second end cap sealed to the second end of the base and the second end of each of the side walls, the second end cap having a fluid passage through the end cap aligned with the at least one cooling channel in each side wall;

b) a cover sealably fitting over the upper edge of the first side wall and the second side wall and over the first end cap and the second end cap, sealing the body and forming a sealed enclosure; and c) a seal between the cover and the upper edge of the first side wall and the second side wall and the first end cap and the second end cap.

2. The enclosure of claim 1, in which at least the upper edge of each of the first side wall and the second side wall has a seal groove, and the seal fits at least partially into the seal groove.

3. The enclosure of claim 1, in which at least one of the first side wall and the second side wall further comprises at least one slot for mounting heat-generating components with spring clips for heat transfer to the side walls of the heat exchanger body.

4. The enclosure of claim 1, further comprising a plurality of heat exchanger fins on the lower surface of the base.

5. The enclosure of claim 1, in which there is a clearance space formed along a lower edge of at least one side wall.

6. The enclosure of claim 1, in which there is a clearance space formed in the base adjacent to at least one side wall.

7. The enclosure of claim 1, in which the first end cap and the second end cap are sealed to the base and the first side wall and the second side wall with face gaskets.

8. The enclosure of claim 1, in which the base further comprises a plurality of mounting rails for mounting a printed circuit board.

9. The enclosure of claim 1, in which the first side wall and the second side wall each have a mounting slot for retaining edges of a printed circuit board.

10. The enclosure of claim 1, in which the base further comprises at least one mounting foot.

11. The enclosure of claim 1, in which a cooling channel in the first side wall is vertically offset from a cooling channel in the second side wall.

12. A system for housing electronic components comprising:

a) a backplane having a front surface and a back surface, an upper edge and a lower edge, a first end and a second end, and a first manifold and a second manifold passing through the backplane between the first end and the second end, the first manifold being vertically offset from the second manifold;

b) a plurality of enclosures for electronic components, each comprising:

i) a heat exchanger body for housing a printed circuit board, comprising:

A) a base having an upper surface, a lower surface, a first end and a second end, and two sides;

B) a first side wall and a second side wall, each side wall having a first end adjacent the first end of the base and a second end adjacent the second end of the base, a lower edge joined to the upper surface of the base along a side of the base and an upper edge;

C) at least one cooling channel extending through each side wall from the first end to the second end, the at least one cooling channel in the first side wall being vertically offset from the at least one cooling channel in the second side wall;

D) a first end cap sealed to the first end of the base and the first end of each of the side walls, having an internal bore extending across the first end cap and having openings aligned with the at least one cooling channel in each of the two side walls, so that the cooling channels in the two side walls are connected through the internal bore in the first end cap; and E) a second end cap sealed to the second end of the base and the second end of each of the side walls, the second end cap having a fluid passage through the end cap aligned with the at least one cooling channel in each side wall;

F) a fluid fitting on the second end cap coupled to each of the fluid passages through the second end cap; and ii) a cover sealably fitting over the upper edge of the two side walls and over the first end cap and the second end cap, sealing the body and forming a sealed enclosure;

c) a plurality of sockets in the front surface of the backplane, located to mate with the fluid fittings on the second end caps of the plurality of enclosures, each socket being fluid coupled to one of the first manifold or the second manifold;

d) a first fluid fitting mounted on the backplane in fluid communication with the first manifold; and e) a second fluid fitting mounted on the backplane in fluid communication with the second manifold.

13. The system of claim 12, in which each enclosure further comprises a seal between the cover and the upper edge of the two side walls and the first end cap and the second end cap.

14. The system of claim 13, in which at least the upper edge of each of the side walls has a seal groove, and the seal fits at least partially into the seal groove.

15. The system of claim 12, in which at least one of the side walls of at least one of the plurality of enclosures further comprises at least one slot for mounting heat-generating components with spring clips for heat transfer to the side walls of the heat exchanger body.

16. The system of claim 12, in which the base of at least one of the plurality of enclosures further comprises a plurality of mounting rails for mounting a printed circuit board.

17. The system of claim 12, in which the first side wall and the second side wall of at least one of the plurality of enclosures each have a mounting slot for retaining edges of a printed circuit board.

18. An enclosure for housing two printed circuit boards having electronic components, comprising:

a) an H-shaped heat exchanger body, comprising:

i) a base having an upper surface, a lower surface, a first end and a second end, and two sides;

ii) an upper chamber for housing a printed circuit board located on the upper surface of the base, and a lower chamber for housing a printed circuit board located on the lower surface of the base, each chamber comprising:

A) a first side wall and a second side wall, each having a first end adjacent the first end of the base and a second end adjacent the second end of the base, a lower edge joined to the upper surface of the base along a side of the base and an upper edge;

B) at least one cooling channel extending through each side wall from the first end to the second end;
C) a first end cap sealed to the first end of the base and the first end of each of the side walls, having an internal bore extending across the first end cap and having openings aligned with the at least one cooling channel in each of the two side walls, so that the cooling channels in the two side walls are connected through the internal bore in the first end cap;
D) a second end cap sealed to the second end of the base and the second end of each of the side walls, the second end cap having a fluid passage through the end cap aligned with the at least one cooling channel in each side wall; and
E) a cover sealably fitting over the upper edge of the first side wall and the second side wall and over the first end cap and the second end cap, sealing the body and forming a sealed enclosure.

* * * * *